United States Patent
Nakajima (10) Patent No.: US 11,418,224 B2
(45) Date of Patent: Aug. 16, 2022

(54) RADIO FREQUENCY MODULE AND COMMUNICATION DEVICE

(71) Applicant: Murata Manufacturing Co., Ltd., Kyoto (JP)

(72) Inventor: Reiji Nakajima, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 316 days.

(21) Appl. No.: 16/844,181

(22) Filed: Apr. 9, 2020

(65) Prior Publication Data
US 2020/0235760 A1  Jul. 23, 2020

Related U.S. Application Data

(63) Continuation of application No. PCT/JP2018/036630, filed on Oct. 1, 2018.

(30) Foreign Application Priority Data

Oct. 11, 2017 (JP) .............................. JP2017-198020

(51) Int. Cl.
*H04B 1/04* (2006.01)
*H04B 1/00* (2006.01)
(Continued)

(52) U.S. Cl.
CPC .............. *H04B 1/006* (2013.01); *H01Q 1/50* (2013.01); *H03H 7/0115* (2013.01); *H03H 7/0161* (2013.01); *H03H 7/38* (2013.01)

(58) Field of Classification Search
CPC .......... H04B 1/06; H04B 1/04; H04B 1/0053; H04B 1/0475; H04B 10/36; H03H 7/0115; H03H 7/0161; H03H 7/38
See application file for complete search history.

(56) References Cited

U.S. PATENT DOCUMENTS

2008/0055016 A1  3/2008 Morris et al.
2013/0309984 A1  11/2013 Uejima
(Continued)

FOREIGN PATENT DOCUMENTS

| JP | 2017-168932 A | 9/2017 |
|---|---|---|
| WO | 2012/121037 A1 | 9/2012 |
| WO | 2016/129401 A1 | 8/2016 |

OTHER PUBLICATIONS

International Search Report for PCT/JP2018/036630 dated Oct. 23, 2018.
Written Opinion for PCT/JP2018/036630 dated Oct. 23, 2018.

*Primary Examiner* — Tuan Pham
(74) *Attorney, Agent, or Firm* — Pearne & Gordon LLP (57) ABSTRACT

An antenna switch of a radio frequency module selectively switches at least between connection between a first connection terminal and a common terminal and connection between a second connection terminal and the common terminal. A first connection terminal receives a signal in a first communication band. A second connection terminal receives a signal in a second communication band. When the second connection terminal and the common terminal are in connection with each other, a variable capacitor (C1, C2) of a filter circuit shifts the attenuation band of the filter circuit to a higher band than that when the first connection terminal and the common terminal are in connection with each other.

13 Claims, 5 Drawing Sheets

(51) Int. Cl.
    *H01Q 1/50*     (2006.01)
    *H03H 7/01*     (2006.01)
    *H03H 7/38*     (2006.01)

(56) References Cited

U.S. PATENT DOCUMENTS

| | | | |
|---|---|---|---|
| 2014/0055210 A1* | 2/2014 | Black | H04B 1/525 |
| | | | 333/132 |
| 2014/0287794 A1 | 9/2014 | Akhi et al. | |
| 2017/0163294 A1* | 6/2017 | Gorbachov | H04B 15/00 |
| 2017/0171791 A1* | 6/2017 | Li | H04W 36/06 |
| 2017/0264336 A1 | 9/2017 | Saji | |
| 2017/0353287 A1 | 12/2017 | Onaka et al. | |

\* cited by examiner

RADIO FREQUENCY MODULE AND COMMUNICATION DEVICE

This is a continuation of International Application No. PCT/JP2018/036630 filed on Oct. 1, 2018 which claims priority from Japanese Patent Application No. 2017-198020 filed on Oct. 11, 2017. The contents of these applications are incorporated herein by reference in their entireties.

BACKGROUND

The present invention relates to a radio frequency module and a communication device that transmit multiple signals by using a common antenna.

It is known that an existing radio frequency module transmits multiple signals by using a common antenna (see International Publication No. 2012/121037).

A radio frequency switch module (radio frequency module) disclosed in International Publication No. 2012/121037 includes two low pass filters. One of the two low pass filters has an attenuation band including the frequency of a secondary harmonic wave of and the frequency of a tertiary harmonic wave of a transmission signal that is inputted from a first transmission signal input terminal and a pass band including the fundamental frequency of the transmission signal. The other low pass filter of the two low pass filters has an attenuation band including the frequency of a secondary harmonic wave of a transmission signal that is inputted from a second transmission signal input terminal and a pass band including the fundamental frequency of the transmission signal.

BRIEF SUMMARY

When there are multiple transmission-signal communication bands that need to attenuate a spurious wave such as a harmonic wave (for example, a frequency component higher than the fundamental frequency) in International Publication No. 2012/121037, it is necessary to provide the low pass filters for the respective communication bands. Accordingly, there is a problem in that the size of the radio frequency module increases as the number of the communication bands that need to attenuate the spurious wave increases.

Figure 7:
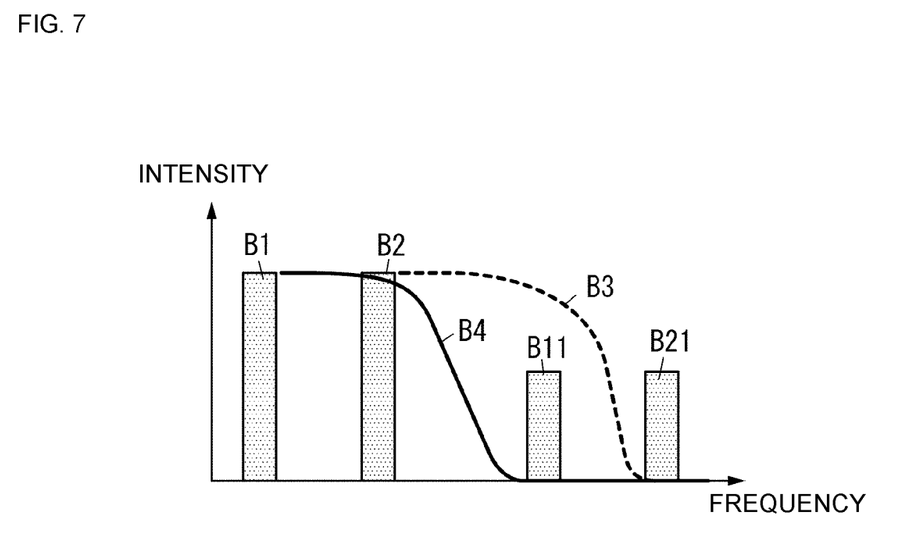
FIG. 7 illustrates a problem of an existing radio frequency module.

It can also be considered that an attenuation band is fixed by a single low pass filter to attenuate the spurious wave when there are multiple transmission-signal communication bands. For example, as illustrated in FIG. 7, it is assumed that transmission signals are transmitted in respective communication bands B1 and B2. The frequency band of the communication band B1 is lower than the frequency band of the communication band B2. In this case, a secondary harmonic wave B11 of the transmission signal in the communication band B1 is a spurious wave in the case of communication in the communication band B1, and a secondary harmonic wave B21 in the transmission signal in the communication band B2 is a spurious wave in the case of communication in the communication band B2 (see FIG. 7). In this case, the secondary harmonic wave B21 can be attenuated depending on settings of the attenuation band. However, there is a possibility that the secondary harmonic wave B11 in the communication band B1 cannot be attenuated (see a dashed line B3 in FIG. 7). If both of the secondary harmonic waves B11 and B21 are to be attenuated, then the communication band B2 is also attenuated depending on the settings of the attenuation band, and there is a possibility that this results in a loss of the transmission signal (see a solid line B4 in FIG. 7).

The present invention provides a radio frequency module and a communication device that enable the size of the radio frequency module to be prevented from increasing and enable a loss of a transmission signal to be reduced even when there are multiple communication bands that need to attenuate a spurious wave.

According to embodiments of the present invention, a radio frequency module includes an antenna connection terminal, an antenna switch, and a filter circuit. The antenna connection terminal is electrically connected to an antenna. The antenna switch includes a common terminal, a first connection terminal, and a second connection terminal and selectively switches at least between connection between the first connection terminal and the common terminal and connection between the second connection terminal and the common terminal. The common terminal is electrically connected to the antenna connection terminal. The first connection terminal receives a signal in a first communication band. The second connection terminal receives a signal in a second communication band. The filter circuit is disposed between the antenna connection terminal and the common terminal, has a pass band in which a fundamental wave of the signal in the first communication band and a fundamental wave of the signal in the second communication band are allowed to pass, and has an attenuation band in which a harmonic wave of the signal in the first communication band and a harmonic wave of the signal in the second communication band are attenuated. The filter circuit includes a variable reactance element. When the second connection terminal and the common terminal are in connection with each other, the variable reactance element shifts the attenuation band of the filter circuit to a higher band than that when the first connection terminal and the common terminal are in connection with each other.

According to embodiments of the present invention, a communication device includes the radio frequency module and the antenna that is electrically connected to the antenna connection terminal. The radio frequency module includes a first transmission circuit that transmits the signal in the first communication band, and a second transmission circuit that transmits the signal in the second communication band.

According to embodiments of the present invention, a radio frequency module and a communication device enable the size of the radio frequency module to be prevented from increasing and enable a loss of a transmission signal to be reduced even when there are multiple communication bands that need to attenuate a spurious wave.

Other features, elements, characteristics and advantages of the present invention will become more apparent from the following detailed description of embodiments of the present invention with reference to the attached drawings.

DETAILED DESCRIPTION

Embodiments and modifications described below are examples of the present invention. The present invention is not limited to the embodiments and the modifications. Other than the embodiments and the modifications, various modifications can be made depending on, for example, design without necessarily departing from the technical concept of the present invention.

First Embodiment (1) Outline

A radio frequency module 1 according to an embodiment will now be described with reference to the drawings.

For example, the radio frequency module 1 is connected to an antenna 40 that transmits signals in communication bands and used in a cellular phone, or a smart phone.

Figure 1:
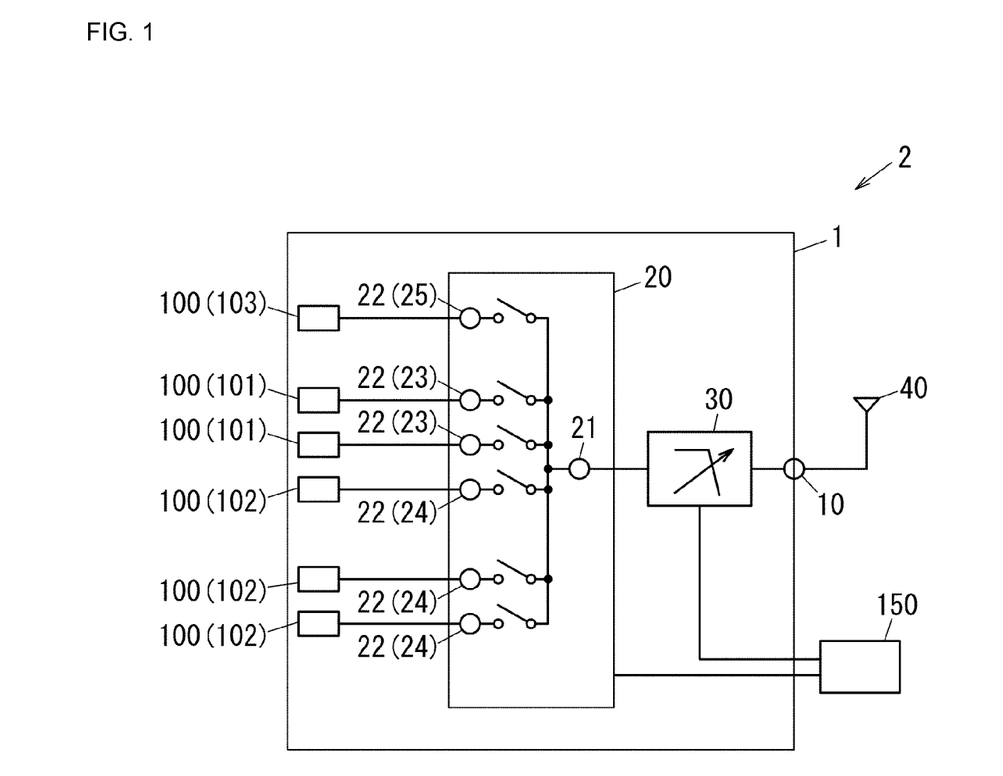
FIG. 1 illustrates the structure of a radio frequency module according to a first embodiment of the present invention.

As illustrated in FIG. 1, the radio frequency module 1 according to the present embodiment is included in a communication device 2. The communication device 2 includes a control circuit 150 in addition to the radio frequency module 1. The communication device 2 according to the present embodiment includes three kinds of transmission circuits 100, which are referred to as first transmission circuits 101, second transmission circuits 102, and a third transmission circuit 103 when distinguished.

The control circuit 150 includes a computer. The main components of the computer include a device that includes a processor that runs a program, an interface device for transmitting a signal to and receiving a signal from another device, and a storage device that stores, for example, a program and data. The device that includes the processor may be a CPU (Central Processing Unit) or a MPU (Micro Processing Unit) that is separated from the storage device or a microcomputer that is integrally formed with the storage device. A storage device such as a semiconductor memory that has a short access time is mainly used as the storage device. As the providing form of the computer, there are a ROM (Read Only Memory) that is readable by the computer, prior storage in a storage medium such as an optical disk, and supply to a storage medium via a broadband network including the internet.

The control circuit 150 performs the function thereof by causing the computer to run the program. The control circuit 150 controls the radio frequency module 1 such that the radio frequency module 1 transmits a signal in a single communication band among a first communication band, a second communication band, and a third communication band described later.

(2) Structure of Radio Frequency Module

The components of the radio frequency module 1 according to the present embodiment will now be described.

As illustrated in FIG. 1, the radio frequency module 1 includes the multiple (six in an example in the figure) transmission circuits 100, an antenna connection terminal 10, an antenna switch 20, and a filter circuit 30. The radio frequency module 1 according to the present embodiment includes the three kinds of the transmission circuits 100, which are referred to as the first transmission circuits 101, the second transmission circuits 102, and the third transmission circuit 103 when distinguished.

The first transmission circuits 101 transmit a signal in, for example, a communication band (a first communication band) of a third generation mobile communication standard (referred to below as a "3G standard") via the radio frequency module 1 and the antenna 40. The second transmission circuits 102 transmit a signal in, for example, a communication band (a second communication band) of a fourth generation mobile communication standard (referred to below as a "4G standard") via the radio frequency module 1 and the antenna 40. The third transmission circuit 103 transmits a signal in, for example, a communication band (a third communication band) of a second generation mobile communication standard (referred to below as a "2G standard") via the radio frequency module 1 and the antenna 40.

In the case where multiple frequency bands are assigned for communication of the 3G standard, that is, multiple frequency bands are assigned as the first communication bands, the first transmission circuits 101 are provided for the respective frequency bands that are assigned as the first communication bands. That is, in the case where N frequency bands are assigned as the first communication bands, N first transmission circuits 101 are provided. In the example in FIG. 1, two frequency bands are assigned as the first communication bands, and two first transmission circuits 101 are associated with the two frequency bands. The frequency bands that are assigned as the first communication bands may not be associated with the respective first transmission circuits 101 in an one-to-one manner. For example, the single first transmission circuit 101 may be provided for two or more frequency bands.

Similarly, in the case where multiple frequency bands are assigned for communication of the 4G standard, that is, multiple frequency bands are assigned as the second communication bands, the second transmission circuits 102 are provided for the respective frequency bands that are assigned as the second communication bands. That is, in the case where N frequency bands are assigned as the second communication bands, N second transmission circuits 102 are provided. In the example in FIG. 1, three frequency bands are assigned as the second communication bands, and three second transmission circuits 102 are associated with the three frequency bands. The frequency bands that are assigned as the second communication bands may not be associated with the respective second transmission circuits 102 in an one-to-one manner. For example, the single second transmission circuit 102 may be provided for two or more frequency bands.

The antenna 40 is electrically connected to the antenna connection terminal 10. The antenna 40 has a function of emitting a radio frequency signal as an electromagnetic wave in a space and a function of receiving an electromagnetic wave that propagates in a space. The antenna 40 outputs, as a reception signal, the received electromagnetic wave to a reception circuit, not illustrated, via the antenna connection terminal 10.

The antenna switch 20 includes multiple semiconductor switches, a single common terminal 21, and multiple (six in the example in the figure) connection terminals 22. The antenna switch 20 selectively changes a connection terminal that is electrically connected to the common terminal 21 among the connection terminals 22. The common terminal 21 is electrically connected to the filter circuit 30. The connection terminals 22 are electrically connected to the corresponding transmission circuits 100. According to the present embodiment, the connection terminals 22 that are connected to the first transmission circuits 101 among the multiple connection terminals 22 are referred to as first connection terminals 23. The connection terminals 22 that are connected to the second transmission circuits 102 among the multiple connection terminals 22 are referred to as second connection terminals 24. The connection terminal 22 that is connected to the third transmission circuit 103 among the multiple connection terminals 22 is referred to as a third connection terminal 25.

The antenna switch 20 is connected to the control circuit 150 with a connection terminal (not illustrated) of the antenna switch 20 interposed therebetween and receives a control signal that is outputted from the control circuit 150. The antenna switch 20 changes the connection terminal 22 that is connected to the common terminal 21 among the multiple connection terminals 22 in accordance with the control signal that is received from the control circuit 150.

Figure 2:
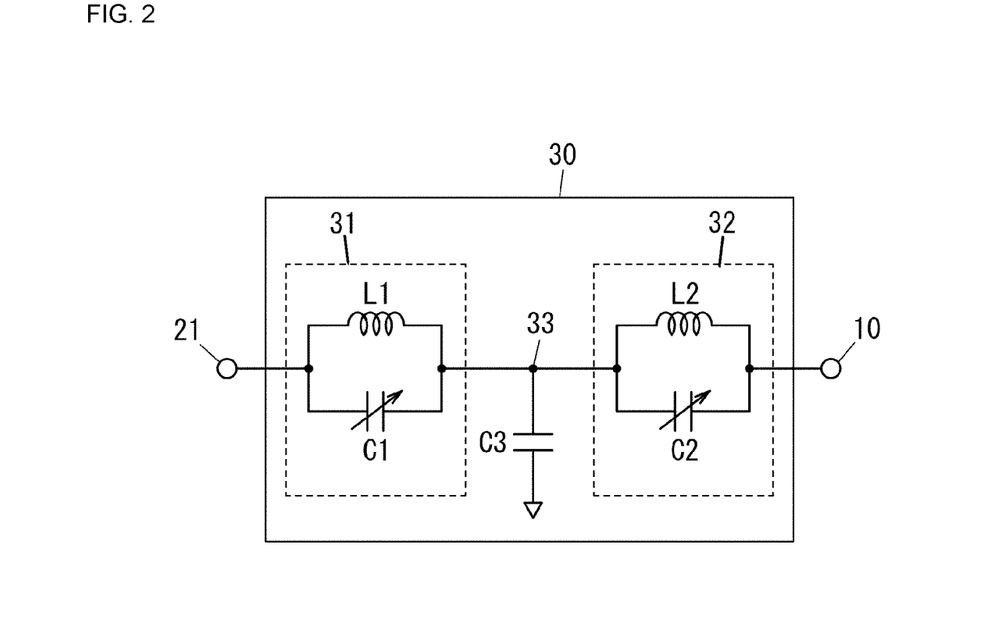
FIG. 2 illustrates the structure of a filter circuit of the radio frequency module in FIG. 1.

The filter circuit 30 is disposed between the antenna connection terminal 10 and the common terminal 21. More specifically, the common terminal 21 is connected to an input port of the filter circuit 30, and the antenna connection terminal 10 is connected to an output port of the filter circuit 30. The filter circuit 30 is a filter that has an attenuation band including the frequency of a secondary harmonic wave and the frequency of a tertiary harmonic wave of a signal (transmission signal) that is outputted from the common terminal 21 to the antenna 40 and a pass band including the fundamental frequency of the transmission signal. That is, the filter circuit 30 has a pass band in which the fundamental wave of the transmission signal is allowed to pass and an attenuation band in which the harmonic waves (the secondary harmonic wave and the tertiary harmonic wave) of the transmission signal are attenuated. The frequency of the secondary harmonic wave is 2 times the frequency (fundamental frequency) of the transmission signal. The frequency of the tertiary harmonic wave is three times the frequency of the transmission signal. The filter circuit 30 includes at least one variable reactance element. Specifically, as illustrated in FIG. 2, the filter circuit 30 includes two inductors L1 and L2, two variable capacitors C1 and C2 that serve as variable reactance elements, and a capacitor C3.

The inductor L1 and the inductor L2 are connected to each other in series between the antenna connection terminal 10 and the common terminal 21. The variable capacitor C1 is connected to the inductor L1 in parallel. The variable capacitor C2 is connected to the inductor L2 in parallel. A set of the variable capacitor C1 and the inductor L1 corresponds to a first filter member 31. A set of the variable capacitor C2 and the inductor L2 corresponds to a second filter member 32. As illustrated in FIG. 2, the first filter member 31 and the second filter member 32 are connected to each other in series.

The capacitor C3 is connected by shunt connection between a connector (node) 33 between the first filter member 31 and the second filter member 32 and a reference electric potential. Specifically, an end of the capacitor C3 is connected to the connector 33, and the other end is connected to the reference electric potential (ground).

The electrostatic capacity (capacitance) of the variable capacitors C1 and C2 is changed by control of the control circuit 150 depending on the communication band of the transmission signal that is inputted in the filter circuit 30.

The control circuit 150 changes the capacitance of the variable capacitor C1 depending on the communication band of the transmission signal such that the first filter member 31 attenuates the secondary harmonic wave of the transmission signal and allows the fundamental wave to pass. Consequently, a set of the inductor L1, the variable capacitor C1, and the capacitor C3 functions as a filter that attenuates the secondary harmonic wave. The control circuit 150 changes the capacitance of the variable capacitor C2 depending on the communication band of the transmission signal such that the second filter member 32 attenuates the tertiary harmonic wave of the transmission signal and allows the fundamental wave to pass. Consequently, a set of the inductor L2, the variable capacitor C2, and the capacitor C3 functions as a filter that attenuates the frequency of the tertiary harmonic wave.

According to the present embodiment, for example, when the second transmission circuit 102 and the common terminal 21 are in connection with each other, the control circuit 150 changes the electrostatic capacity of the variable capacitors C1 and C2 such that the attenuation band shifts to a hither band than that when the first transmission circuit 101 and the common terminal 21 are in connection with each other. In other words, when the second transmission circuit 102 and the common terminal 21 are in connection with each other, control of the control circuit 150 causes the variable capacitors C1 and C2 to shift the attenuation band to a higher band than that when the first transmission circuit 101 and the common terminal 21 are in connection with each other.

(3) Modification

According to the present embodiment, the filter circuit 30 includes the first filter member 31 and the second filter member 32 that serve as variable filter members that include the capacitors the capacitance of which is variable but is not limited to this structure. The first filter member 31 or the second filter member 32 may be a fixed filter that includes a capacitor the capacitance of which is fixed.

The first filter member 31 and the second filter member 32 are electrically connected to each other in this order in the direction from the common terminal 21 toward the antenna connection terminal 10 but are not limited to this structure. The second filter member 32 and the first filter member 31 may be electrically connected to each other in this order in the direction from the common terminal 21 toward the antenna connection terminal 10.

According to the present embodiment, the number of the third transmission circuit 103 is 1 but this structure is not a limitation. There may be multiple third transmission circuits 103.

According to the present embodiment, the antenna 40 has the function of emitting a radio frequency signal as an electromagnetic wave in a space and the function of receiving an electromagnetic wave that propagates in a space but is not limited to this structure. The antenna 40 may have only the function of emitting a radio frequency signal as an electromagnetic wave in a space. That is, it is only necessary for the antenna 40 to have the function of emitting a radio frequency signal as an electromagnetic wave in a space.

According to the present embodiment, the attenuation band of the filter circuit 30 may include the frequencies of quaternary or more harmonic waves to be attenuated.

According to the present embodiment, frequency components other than those of the harmonic waves may be attenuated by changing the capacitance of the variable capacitor C1, the variable capacitor C2, or both.

(4) Effects

In the radio frequency module 1 according to the present embodiment described above, the filter circuit 30 is disposed between the antenna connection terminal 10 and the common terminal 21 of the antenna switch 20, and the pass band and the attenuation band are changed depending on the communication band of the transmission signal. This enables a size to be smaller than that in the case where filters are disposed for respective transmission circuits.

When the second transmission circuit 102 and the common terminal 21 are in connection with each other, control of the control circuit 150 causes the variable capacitors C1 and C2 to shift the attenuation band to a higher band than that when the first transmission circuit 101 and the common terminal 21 are in connection with each other. That is, the attenuation band is changed depending on the frequency of the transmission signal. This enables a loss of the transmission signal (fundamental wave of the signal) at the fundamental frequency due to the filter circuit 30 to be smaller than that in the case where the attenuation band is fixed to a single value for multiple transmission signals even when a transmission signal of the multiple transmission signals is transmitted.

The filter circuit 30 includes the inductors and the variable capacitors. Accordingly, a combination of the inductors and the variable capacitors enables impedance matching between the antenna switch 20 and the antenna 40.

Second Embodiment

The present embodiment differs from the first embodiment in that a switch member that differs from the antenna switch switches between communication in the third communication band and communication in the first communication band or the second communication band. Differences from the first embodiment will now be mainly described with reference to FIG. 3 and FIG. 4. Components like to those according to the first embodiment are designated by like reference characters, and a description thereof is appropriately omitted.

Figure 3:
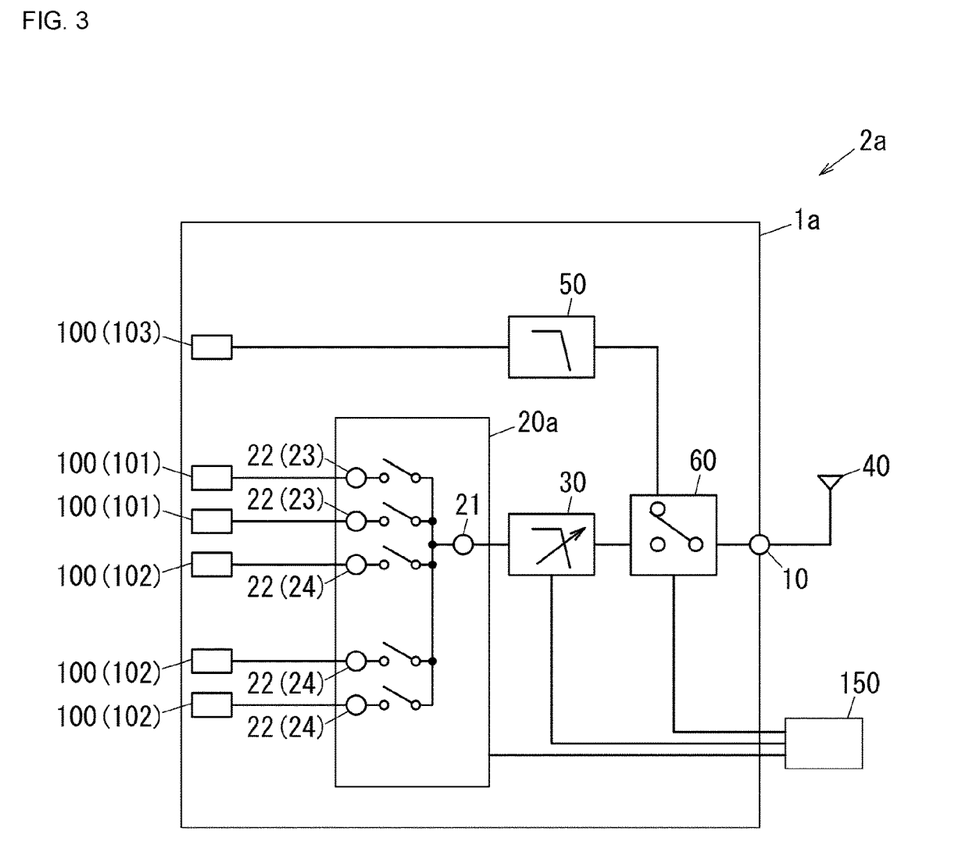
FIG. 3 illustrates the structure of a radio frequency module according to a second embodiment of the present invention.

As illustrated in FIG. 3, a radio frequency module 1a according to the present embodiment is included in a communication device 2a. The communication device 2a includes the control circuit 150 in addition to the radio frequency module 1a.

As illustrated in FIG. 3, the radio frequency module 1a according to the present embodiment includes the multiple first transmission circuits 101, the multiple second transmission circuits 102, the third transmission circuit 103, the antenna connection terminal 10, an antenna switch 20a, the filter circuit 30, a fixed filter circuit 50, and a switch member 60.

The first transmission circuits 101 transmit a signal in the first communication band via the antenna 40. The second transmission circuits 102 transmit a signal in the second communication band via the antenna 40. The third transmission circuit 103 transmits a signal in the third communication band via the antenna 40.

The antenna switch 20a includes multiple semiconductor switches, the single common terminal 21, and the multiple connection terminals 22. The common terminal 21 is electrically connected to the filter circuit 30. The connection terminals 22 are electrically connected to the corresponding transmission circuits among the multiple first transmission circuits 101 and the multiple second transmission circuits 102. The antenna switch 20a is connected to the control circuit 150 and receives a control signal that is outputted from the control circuit 150. The antenna switch 20a changes the connection terminal 22 that is connected to the common terminal 21 among the multiple connection terminals 22 in accordance with the control signal that is received from the control circuit 150. That is, the transmission circuit that is connected to the common terminal 21 among the multiple first transmission circuits 101 and the multiple second transmission circuits 102 is changed. According to the present embodiment, the connection terminals 22 that are connected to the first transmission circuits 101 among the multiple connection terminals 22 are referred to as the first connection terminals 23, and the connection terminals 22 that are connected to the second transmission circuits 102 are referred to as the second connection terminals 24, as in first embodiment. The antenna switch 20a selectively changes a connection terminal that is electrically connected to the common terminal 21 among the multiple first connection terminals 23 and the multiple second connection terminals 24.

Figure 4:
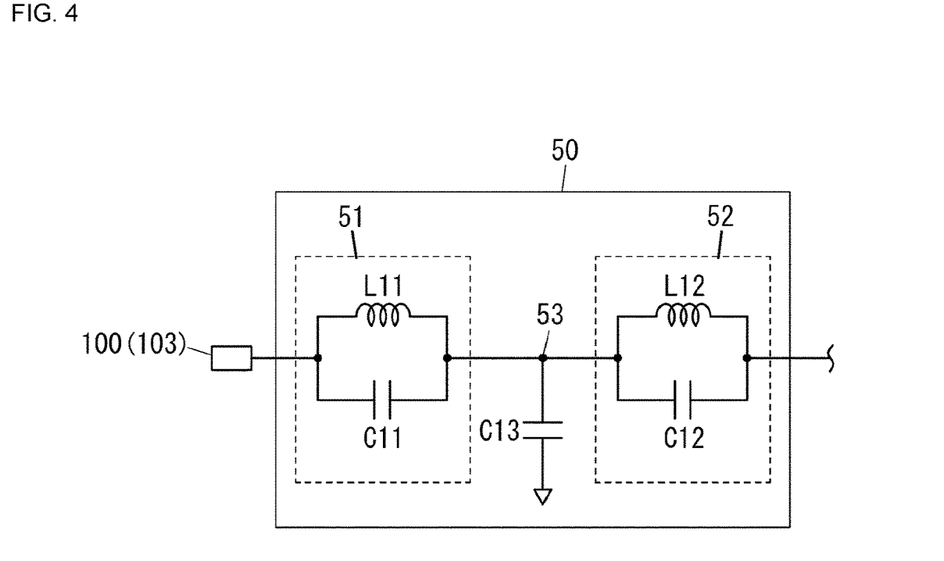
FIG. 4 illustrates the structure of a fixed filter circuit of the radio frequency module in FIG. 3.

The fixed filter circuit 50 is disposed between the antenna connection terminal 10 and the third transmission circuit 103. The fixed filter circuit 50 is a filter that has an attenuation band including the frequency of the secondary harmonic wave and the frequency of the tertiary harmonic wave of the transmission signal that is outputted from the third transmission circuit 103 to the antenna 40 and a pass band including the fundamental frequency of the transmission signal. That is, the fixed filter circuit 50 has a pass band in which the fundamental wave of the transmission signal is allowed to pass and an attenuation band in which the harmonic waves (the secondary harmonic wave and the tertiary harmonic wave) of the transmission signal are attenuated. Specifically, as illustrated in FIG. 4, the fixed filter circuit 50 includes two inductors L11 and L12 and three capacitors C11, C12, and C13.

The inductor L11 and the inductor L12 are connected to each other in series between the antenna connection terminal 10 and the third transmission circuit 103. The capacitor C11 is connected to the inductor L11 in parallel. The capacitor C12 is connected to the inductor L12 in parallel. A set of the capacitor C11 and the inductor L11 corresponds to a first fixed filter member 51. A set of the capacitor C12 and the inductor L12 corresponds to a second fixed filter member 52. As illustrated in FIG. 4, the first fixed filter member 51 and the second fixed filter member 52 are connected to each other in series.

The capacitor C13 is connected by shunt connection between a connector 53 between the first fixed filter member 51 and the second fixed filter member 52 and the reference electric potential. Specifically, an end of the capacitor C13 is connected to the connector 53, and the other end is connected to the reference electric potential (ground).

Appropriate settings of the capacitance of the capacitor C11 and the inductance of the inductor L11 enable the filter to attenuate the secondary harmonic wave of the signal (transmission signal) that is transmitted from the third transmission circuit 103 and to allow the fundamental wave to pass. Appropriate settings of the capacitance of the capacitor C12 and the inductance of the inductor L12 enable the filter to attenuate the tertiary harmonic wave (transmission signal) of the signal that is transmitted from the third transmission circuit 103 and to allow the fundamental wave to pass.

The filter circuit 30 according to the present embodiment is disposed between the antenna connection terminal 10 and the common terminal 21. The filter circuit 30 is a filter that has an attenuation band in which the frequency of the secondary harmonic wave and the frequency of the tertiary harmonic wave of the signal (transmission signal) that is outputted from the common terminal 21 to the antenna 40 are attenuated and a pass band in which the fundamental frequency of the transmission signal is allowed to pass. The filter circuit 30 is a filter that attenuates the secondary harmonic wave and the tertiary harmonic wave of the signal that is transmitted from each of the first transmission circuits 101 and the second transmission circuits 102 and allows the fundamental wave of the transmission signal to pass. The filter circuit 30 according to the present embodiment includes the two inductors L1 and L2 and the two variable capacitors C1 and C2 that serve as variable reactance elements, and the capacitor C3 (see FIG. 2) as in the first embodiment. When the second transmission circuit 102 and the common terminal 21 are in connection with each other, control of the control circuit 150 causes the variable capacitors C1 and C2 according to the present embodiment to shift the attenuation band to a higher band than that when the first transmission circuit 101 and the common terminal 21 are in connection with each other.

As illustrated in FIG. 3, the switch member 60 is connected to the control circuit 150 and receives a control signal that is outputted from the control circuit 150. The switch member 60 switches between the filter circuit 30 and the fixed filter circuit 50 as the filter circuit that is connected to the antenna connection terminal 10 in accordance with the control signal that is received from the control circuit 150.

According to the present embodiment, the first fixed filter member 51 and the second fixed filter member 52 are electrically connected to each other in this order in the direction from the third transmission circuit 103 toward the antenna connection terminal 10 but are not limited to this structure. The second fixed filter member 52 and the first fixed filter member 51 may be electrically connected to each other in this order in the direction from the third transmission circuit 103 toward the antenna connection terminal 10.

According to the present embodiment, the number of the third transmission circuit 103 is 1 but this structure is not a limitation. There may be multiple third transmission circuits 103. In the case where there are the multiple third transmission circuits 103, the radio frequency module 1*a* includes a variable filter circuit that has the same structure as that of the filter circuit 30 instead of the fixed filter circuit 50. In this case, the capacitance of the variable capacitor of the variable filter circuit is changed depending on the communication bands of the third transmission circuits.

In the radio frequency module 1*a* according to the present embodiment, the filter circuit is shared for communication in the first communication band and communication in the second communication band as described above. Accordingly, the size of the radio frequency module 1*a* can be decreased as in the first embodiment.

The attenuation band of the filter circuit 30 is changed depending on the frequency of the transmission signal as in the first embodiment. This enables a loss of the transmission signal (fundamental wave of the transmission signal) at the fundamental frequency due to the filter circuit 30 to be smaller than that in the case where the attenuation band is fixed to a single value for multiple transmission signals even when a transmission signal of the multiple transmission signals is transmitted.

The transmission power of communication of the 2G standard is much greater than the transmission power of communication of the 3G standard and the transmission power of communication of the 4G standard. Accordingly, in the case where a single antenna switch switches between communication of the 2G standard and communication of the 3G or 4G standard, the component size of the antenna switch is increased in consideration of withstand voltage for communication of the 2G standard. Consequently, there is a possibility that the size of an entire radio frequency module increases. According to the present embodiment, however, the single antenna switch 20*a* does not switch between communication of the 2G standard and communication of the 3G standard or the 4G standard. That is, the single antenna switch 20*a* does not switch between the third transmission circuit 103 for the 2G standard and the first transmission circuits 101 for the 3G standard or the second transmission circuits 102 for the 4G standard. The antenna switch 20*a* switches between communication of the 3G standard and communication of the 4G standard. That is, the antenna switch 20*a* excludes the third transmission circuit 103 for the 2G standard from a subject to be switched. Accordingly, it is not necessary to consider the withstand voltage for communication of the 2G standard regarding the antenna switch 20*a*, and the size of the antenna switch 20*a* can be decreased. Consequently, the size of the entire radio frequency module 1*a* can also be decreased.

The connection terminals 22 that are included in the antenna switch 20*a* according to the present embodiment are electrically connected to the corresponding transmission circuits among the multiple first transmission circuits 101 and multiple second transmission circuits 102. That is, the antenna switch 20*a* is not electrically connected to the third transmission circuit 103 for communication of the 2G standard. Accordingly, the third transmission circuit 103 is not electrically connected to the common terminal 21, and it is not necessary to increase the withstand power of the antenna switch 20*a*.

Third Embodiment

The present embodiment differs from the second embodiment in the structure for switching between communication in the third communication band and communication in the first communication band or the second communication band. Differences from the first and second embodiments will now be mainly described with reference to FIG. 5. Components like to those according to the first and second embodiments are designated by like reference characters, and a description thereof is appropriately omitted.

Figure 5:
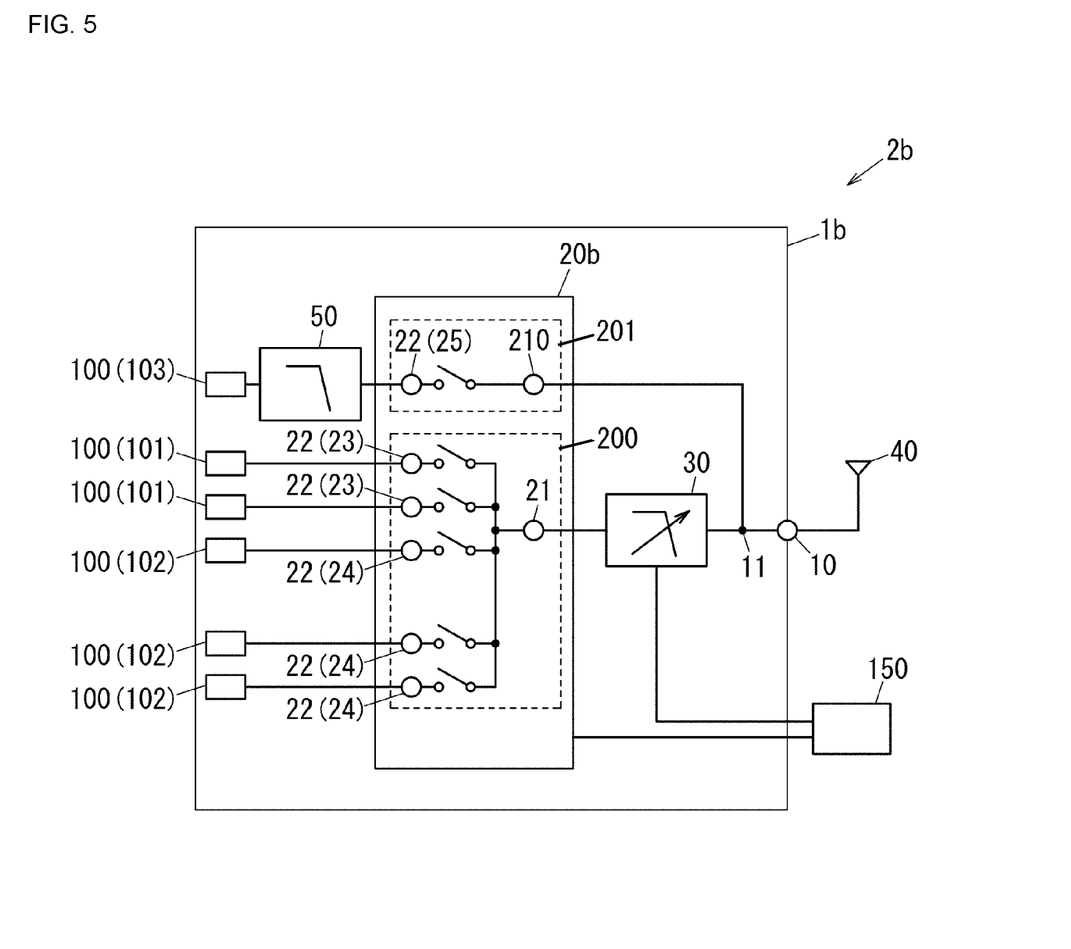
FIG. 5 illustrates the structure of a radio frequency module according to a third embodiment of the present invention.

As illustrated in FIG. 5, a radio frequency module 1*b* according to the present embodiment is included in a communication device 2*b*. The communication device 2*b* includes the control circuit 150 in addition to the radio frequency module 1*b*.

As illustrated in FIG. 5, the radio frequency module 1*b* according to the present embodiment includes the multiple first transmission circuits 101, the multiple second transmission circuits 102, the third transmission circuit 103, the antenna connection terminal 10, an antenna switch 20*b*, the filter circuit 30, and the fixed filter circuit 50.

The first transmission circuits 101 transmit a signal in the first communication band via the radio frequency module 1*b* and the antenna 40. The second transmission circuits 102 transmit a signal in the second communication band via the radio frequency module 1*b* and the antenna 40. The third transmission circuit 103 transmits a signal in the third communication band via the radio frequency module 1*b* and the antenna 40.

The third transmission circuit 103 according to the present embodiment is electrically connected to the third connection terminal 25 of the antenna switch 20*b* with the fixed filter circuit 50 interposed therebetween.

The antenna switch 20*b* includes multiple semiconductor switches, a first switch member 200, and a second switch member 201. The antenna switch 20*b* selectively changes a connection terminal that is electrically connected to the common terminal 21 among the multiple first connection terminals 23 and the multiple second connection terminals 24.

The first switch member 200 includes the single common terminal 21, the multiple (five in an example in the figure) connection terminals 22, which are the multiple (two in the example in the figure) first connection terminals 23 and the multiple (three in the example in the figure) second connection terminals 24 here. The common terminal 21 is electrically connected to the filter circuit 30. The connection terminals 22 are electrically connected to the corresponding transmission circuits among the multiple first transmission circuits 101 and the multiple second transmission circuits 102.

The second switch member 201 is a SPST (Single-Pole Single-Throw) switch. At an end of the second switch member 201, the connection terminal 22 (here, the third connection terminal 25) is disposed. At the other end, a fourth connection terminal 210 is disposed. The fixed filter circuit 50 is connected to the third connection terminal 25 as above. The fourth connection terminal 210 is connected to a connector 11 between the filter circuit 30 and the antenna connection terminal 10.

The antenna switch 20b is connected to the control circuit 150 and receives a control signal that is outputted from the control circuit 150. The antenna switch 20b controls open and close (ON and OFF) of the first switch member 200 and the second switch member 201 in accordance with the control signal that is received from the control circuit 150. For example, when a control signal that instructs the second switch member 201 is switched on (a close state or a connection state) is received, the antenna switch 20b switches on the second switch member 201 and switched off switches between the multiple first connection terminals 23 and the common terminal 21 and between the multiple second connection terminals 24 and the common terminal 21 (an open state or a non-connection state). When the first switch member 200 receives a control signal that instructs the common terminal 21 and at least one of the connection terminals 22 among the multiple first connection terminals 23 and the multiple second connection terminals 24 are switched on, the antenna switch 20b switches on the common terminal 21 and the at least one of the connection terminals 22 and switches off the second switch member 201.

The filter circuit 30 according to the present embodiment is disposed between the antenna connection terminal 10 and the common terminal 21. The filter circuit 30 is a filter that has an attenuation band in which the frequency of the secondary harmonic wave and the frequency of the tertiary harmonic wave of the signal (transmission signal) that is outputted from the common terminal 21 to the antenna 40 are attenuated and a pass band in which the fundamental frequency of the transmission signal is allowed to pass. The filter circuit 30 according to the present embodiment is a filter that attenuates the frequency of the secondary harmonic wave and the tertiary harmonic wave of the signal that is transmitted from each of the first transmission circuits 101 and the second transmission circuits 102 and allows the fundamental wave of the transmission signal to pass as in the second embodiment. The filter circuit 30 according to the present embodiment includes the two inductors L1 and L2 and the two variable capacitors C1 and C2 that serve as variable reactance elements, and the capacitor C3 (see FIG. 2) as in the first and second embodiments. When the second transmission circuit 102 and the common terminal 21 are in connection with each other, control of the control circuit 150 causes the variable capacitors C1 and C2 according to the present embodiment to shift the attenuation band to a higher band than that when the first transmission circuit 101 and the common terminal 21 are in connection with each other.

According to the present embodiment, the first fixed filter member 51 (see FIG. 4) and the second fixed filter member 52 (see FIG. 4) of the fixed filter circuit 50 are electrically connected to each other in this order in the direction from the third transmission circuit 103 toward the antenna connection terminal 10 as in the second embodiment. The second fixed filter member 52 and the first fixed filter member 51 may be electrically connected to each other in this order.

The second switch member 201 is included in the antenna switch 20b but is not limited to this structure. The second switch member 201 may be included in another body other than the antenna switch 20b.

The second switch member 201 may be a switch that differs from a SPST switch. An example thereof may be a SPMT (Single-Pole Multi-Throw) switch. For example, in the case of using a SPMT switch, filter circuits are connected to respective connections that can be made with the common terminal 21. In the radio frequency module in this case, the filter circuit that is connected by switching operation of the SPMT switch attenuates a radio frequency. In the case of using a SPST switch as the second switch member 201, the stray capacitance of the capacitor with the switch being in an open state can be decreased unlike the case of using a SPMT switch. Consequently, communication efficiency of the radio frequency module 1b can be advantageously improved.

According to the present embodiment, the number of the third transmission circuit 103 is 1 but this structure is not a limitation. There may be multiple third transmission circuits 103. In the case where there are the multiple third transmission circuits 103, the radio frequency module 1b includes a variable filter circuit that has the same structure as that of the filter circuit 30 instead of the fixed filter circuit 50. In this case, the capacitance of the variable capacitor of the variable filter circuit is changed depending on the communication bands of the third transmission circuits.

In the radio frequency module 1b according to the present embodiment, the filter circuit is shared for communication in the first communication band and communication in the second communication band as described above. Accordingly, the size of the radio frequency module 1b can be decreased as in the first and second embodiments.

The attenuation band of the filter circuit 30 is changed depending on the frequency of the transmission signal as in the first and second embodiments. This enables a loss of the transmission signal (fundamental wave of the transmission signal) at the fundamental frequency due to the filter circuit 30 to be smaller than that in the case where the attenuation band is fixed to a single value for multiple transmission signals even when a transmission signal of the multiple transmission signals is transmitted.

In the case where a switch (comparison switch) is disposed between the filter circuit 30 and the antenna connection terminal 10, and communication in the third communication band and communication in the first communication band or the second communication band are switched, transmission of a signal in the first communication band or the second communication band is affected by ON-resistance of the comparison switch. This results in a loss of the signal in the first communication band or the second communication band, and there is a possibility that the communication efficiency of a radio frequency module decreases. In the radio frequency module 1b according to the present embodiment, the first switch member 200 and the second switch member 201 are controlled. The loss of the signal in the first communication band or the second communication band is smaller than that in the case of using the comparison switch, and the communication efficiency can be prevented from decreasing.

Fourth Embodiment

The present embodiment differs from the third embodiment in a subject to which the fourth connection terminal 210 of the second switch member 201 is connected. Differences from the first to third embodiments will be mainly described with reference to FIG. 6. Components like to those according to the first to third embodiments are designated by like reference characters, and a description thereof is appropriately omitted.

Figure 6:
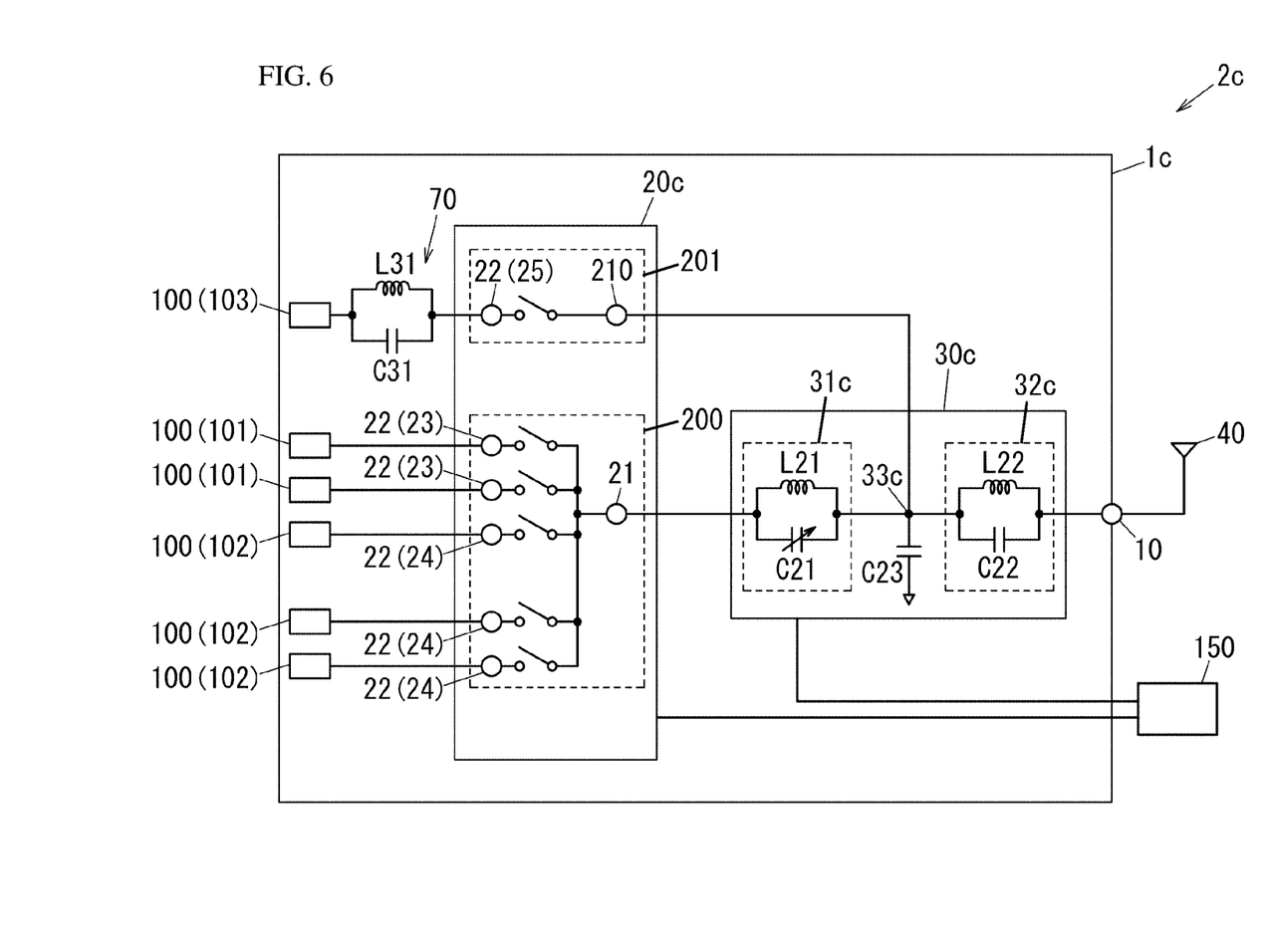
FIG. 6 illustrates the structure of a radio frequency module according to a fourth embodiment of the present invention.

As illustrated in FIG. 6, a radio frequency module 1c according to the present embodiment is included in a communication device 2c. The communication device 2c includes the control circuit 150 in addition to the radio frequency module 1c.

As illustrated in FIG. 6, the radio frequency module 1c according to the present embodiment includes the multiple first transmission circuits 101, the multiple second transmission circuits 102, the third transmission circuit 103, the antenna connection terminal 10, an antenna switch 20c, a filter circuit 30c, and a fixed filter circuit 70.

The first transmission circuits 101 transmit a signal in the first communication band via the radio frequency module 1c and the antenna 40. The second transmission circuits 102 transmit a signal in the second communication band via the radio frequency module 1c and the antenna 40. The third transmission circuit 103 transmits a signal in the third communication band via the radio frequency module 1c and the antenna 40.

The fixed filter circuit 70 is disposed between the third transmission circuit 103 and the third connection terminal 25 of the antenna switch 20c. As illustrated in FIG. 6, the fixed filter circuit 70 includes an inductor L31 and a capacitor C31. The inductor L31 and the capacitor C31 are connected to each other in parallel. In the fixed filter circuit 70, the capacitance of the capacitor C31 is set in advance such that the secondary harmonic wave of the transmission signal that is transmitted from the third transmission circuit 103 is attenuated, and the fundamental wave is allowed to pass. Consequently, a set of the inductor L31, the capacitor C31, and a capacitor C23 functions as a filter that attenuates the secondary harmonic wave.

The filter circuit 30c is disposed between the antenna connection terminal 10 and the common terminal 21 of the antenna switch 20c. As illustrated in FIG. 6, the filter circuit 30c includes inductors L21 and L22, a variable capacitor C21 that serves as a variable reactance element, and two capacitors C22 and C23.

The inductor L21 and the inductor L22 are connected to each other in series between the antenna connection terminal 10 and the common terminal 21. The variable capacitor C21 is connected to the inductor L21 in parallel. The capacitor C22 is connected to the inductor L22 in parallel. A set of the variable capacitor C21 and the inductor L21 corresponds to a first filter member 31c. A set of the capacitor C22 and the inductor L22 corresponds to a second filter member 32c.

The capacitor C23 is coupled to a connector 33c between the first filter member 31c and the second filter member 32c by shunt coupling with the reference electric potential. Specifically, an end of the capacitor C23 is connected to the connector 33c, and the other end is connected to the reference electric potential (ground).

The capacitance of the variable capacitor C21 is changed under control of the control circuit 150 depending on the communication band of the transmission signal that is inputted in the filter circuit 30c. The control circuit 150 changes the capacitance of the variable capacitor C21 depending on the communication band of the transmission signal such that the secondary harmonic wave is attenuated, and the fundamental wave is allowed to pass. Consequently, a set of the inductor L21, the variable capacitor C21, and the capacitor C23 functions as a filter that attenuates the secondary harmonic wave.

According to the present embodiment, for example, when the second transmission circuit 102 and the common terminal 21 are in connection with each other, the control circuit 150 changes the electrostatic capacity of the variable capacitor C21 such that the attenuation band shifts to a higher band than when the first transmission circuit 101 and the common terminal 21 are in connected with each other. In other words, when the second transmission circuit 102 and the common terminal 21 are in connection with each other, control of the control circuit 150 causes the variable capacitor C21 to shift the attenuation band to a higher band than when the first transmission circuit 101 and the common terminal 21 are in connection with each other.

That is, the first filter member 31c that includes the variable capacitor C21 is a filter that has an attenuation band in which the secondary harmonic wave of the signal (transmission signal) that is outputted from the common terminal 21 to the antenna 40 is attenuated and a pass band in which the fundamental wave of the transmission signal is allowed to pass. In other words, the first filter member 31c is a circuit that generates the attenuation pole of a second harmonic (secondary harmonic wave) for the transmission signal.

The capacitance of the capacitor C22 is set in advance such that the tertiary harmonic wave of the transmission signal of the third transmission circuit 103 is attenuated, and the fundamental wave is allowed to pass. Consequently, a set of the inductor L22 and the capacitors C22 and C23 functions as a filter that attenuates the tertiary harmonic wave for the transmission signal of the third transmission circuit 103. That is, the second filter member 32c has an attenuation band in which the tertiary harmonic wave of the signal (transmission signal) that is outputted from the common terminal 21 or the fourth connection terminal 210 to the antenna 40 is attenuated and a pass band in which the fundamental wave of the transmission signal is allowed to pass. In other words, the second filter member 32c is a circuit that generates the attenuation pole of a third harmonic (tertiary harmonic wave) for the transmission signal.

The antenna switch 20c has the same structure as that of the antenna switch 20b according to the second embodiment. However, the fourth connection terminal 210 of the second switch member 201 is connected to a different subject from that according to the second embodiment. The antenna switch 20c selectively changes a connection terminal that is electrically connected to the common terminal 21 among the multiple first connection terminals 23 and the multiple second connection terminals 24 as in the antenna switch 20b according to the second embodiment.

The fourth connection terminal 210 according to the present embodiment is electrically connected to the connector 33c between the first filter member 31c and the second filter member 32c. That is, the third transmission circuit 103 is electrically connected to the connector 33c between the first filter member 31c and the second filter member 32c with the fixed filter circuit 70 and the second switch member 201 interposed therebetween. The first filter member 31c is the circuit that generates the attenuation pole of the second harmonic for the transmission signal as described above. The second filter member 32c is the circuit that generates the attenuation pole of the third harmonic for the transmission signal.

Consequently, when the third connection terminal 25 is in a conducting state, the multiple first connection terminals 23 and the multiple second connection terminals 24 are in a non-conducting state. Accordingly, the attenuation pole can be adjusted with respect to the variable capacitor C21 as if the first filter member 31c is invisible.

When the third connection terminal 25 is in a non-conducting state, any one connection terminal 22 of the multiple first connection terminals 23 (22) and the multiple second connection terminals 24 (22) is in a conducting state. Accordingly, the attenuation pole can be adjusted with respect to the variable capacitor C21 such that the harmonic wave of the signal that is transmitted from the transmission circuit 100 (the first transmission circuit 101 or the second transmission circuit 102) corresponding to the connection terminal 22 in the conducting state is prevented.

According to the present embodiment, the number of the third transmission circuit 103 is 1 but this structure is not a limitation. There may be multiple third transmission circuits 103. In the case where there are the multiple third transmission circuits 103, the radio frequency module 1c includes a variable filter circuit that has the same structure as that of the first filter member 31c of the filter circuit 30c instead of the fixed filter circuit 70. In this case, the capacitance of the variable capacitor of the variable filter circuit is changed depending on the communication bands of the third transmission circuits.

According to the present embodiment, the filter circuit 30c may have an attenuation band including the frequencies of quaternary or more harmonic waves to be attenuated.

According to the present embodiment, frequency components other than those of the harmonic waves may be attenuated by changing the capacitance of the variable capacitor C21.

In the radio frequency module 1c according to the present embodiment, the filter circuit is shared for communication in the first communication band and communication in the second communication band as described above. Accordingly, the size of the radio frequency module 1c can be decreased as in the first to third embodiments.

The attenuation band of the first filter member 31c is changed depending on the frequency of the transmission signal as in the first to third embodiments. This enables a loss of the transmission signal (fundamental wave of the transmission signal) at the fundamental frequency due to the first filter member 31c to be smaller than that in the case where the attenuation band is fixed to a single value for multiple transmission signals even when a transmission signal of the multiple transmission signals is transmitted.

In the case where the switch (comparison switch) is disposed between the filter circuit 30 and the antenna connection terminal 10, and communication in the third communication band and communication in the first communication band or the second communication band are switched, transmission of the signal in the first communication band or the second communication band is affected by the ON-resistance of the comparison switch. This results in a loss of the signal in the first communication band or the second communication band, and there is a possibility that the communication efficiency of a radio frequency module decreases. In the radio frequency module 1c according to the present embodiment, the first switch member 200 and the second switch member 201 are controlled. The loss of the signal in the first communication band or the second communication band is smaller than that in the case of using the comparison switch, and the communication efficiency of the radio frequency module 1c can be prevented from decreasing.

For example, in the case where the second switch member 201 is connected between the fixed filter circuit 50 and the antenna connection terminal 10 as in the third embodiment, the series resonance of the inductor L2 and the variable capacitor C1 appears in the connector 11 even when the second switch member 201 is switched off, and this results in a loss of the signal of the third transmission circuit 103. According to the present embodiment, the second switch member 201 is connected to the connector 33c between the first filter member 31c of the filter circuit 30c and the second filter member 32c, and the loss of the signal of the third transmission circuit 103 is reduced. Accordingly, the communication efficiency of the third transmission circuit 103 of the radio frequency module 1c according to the present embodiment is improved.

Other Modifications

Other modifications will now be described. The modifications described below can be appropriately combined with the above embodiments.

The first communication band is the communication band of the 3G standard, and the second communication band is the communication band of the 4G standard. However, this is not a limitation. In the case where multiple frequency bands are set for communication of the 3G standard, at least one frequency band of the multiple frequency bands may be the first communication band, and another frequency band may be the second communication band. Similarly, in the case where multiple frequency bands are set for communication of the 4G standard, at least one frequency band of the multiple frequency bands may be the first communication band, and another frequency band may be the second communication band.

The control circuit 150 may be disposed in the radio frequency module 1 (1a to 1c). The antenna switch 20 (20a to 20c) may have the function of controlling the antenna switch 20 (20a to 20c) performed by the control circuit 150. The filter circuit 30 (30c) may have the function of controlling the filter circuit 30 (30c) performed by the control circuit 150.

According to the embodiments, the multiple transmission circuits 100 are included in the radio frequency module 1 (1a to 1c). However, the multiple transmission circuits 100 are not necessarily be included in the components of the radio frequency module 1 (1a to 1c).

SUMMARY

It is clear from the above embodiments that the invention includes the following aspects.

A radio frequency module (1, 1a, 1b, 1c) according to a first aspect includes the antenna connection terminal (10), the antenna switch (20, 20a, 20b, 20c), and the filter circuit (30, 30c). The antenna connection terminal (10) is electrically connected to the antenna (40). The antenna switch (20, 20a, 20b, 20c) includes the common terminal (21), the first connection terminal (23), and the second connection terminal (24) and selectively switches at least between connection between the first connection terminal (23) and the common terminal and connection between the second connection terminal (24) and the common terminal (21). The common terminal (21) is electrically connected to the antenna connection terminal (10). The first connection terminal (23) receives a signal in the first communication band. The second connection terminal (24) receives a signal in the second communication band. The filter circuit (30, 30c) is disposed between the antenna connection terminal (10) and the common terminal (21), has a pass band in which the fundamental wave of the signal in the first communication band and the fundamental wave of the signal in the second communication band are allowed to pass, and has an attenuation band in which the harmonic wave of the signal in the first communication band and the harmonic wave of the signal in the second communication band are attenuated. The filter circuit (30, 30c) includes a variable reactance element (for example, the variable capacitor C1, C2). When the second connection terminal (24) and the common terminal (22) are in connection with each other, the variable reactance element shifts the attenuation band of the filter circuit (30, 30c) to a higher band than that when the first connection terminal (23) and the common terminal (22) are in connection with each other.

With this structure, the filter circuit (30, 30c) is disposed between the antenna connection terminal (10) and the common terminal (21) and includes at least one variable reactance element. Accordingly, the radio frequency module (1, 1a, 1b, 1c) can change a spurious wave that is attenuated depending on the fundamental frequency of the signal to be transmitted, and the harmonic waves of the multiple communication bands (the first communication band and the second communication band) can be attenuated. The size can be smaller than that in the case where multiple filter circuits corresponding to the transmission circuits are provided, that is, the size can be prevented from increasing. In addition, a loss of the fundamental wave (transmission signal at the fundamental frequency) of the transmission signal can be reduced.

In a radio frequency module (1, 1a, 1b, 1c) according to a second aspect, the filter circuit (30, 30c) includes the capacitor (C3, C23), the first filter member (31, 31c), and the second filter member (32, 32c) that is connected to the first filter member (31, 31c) in series in addition to the first aspect. The first filter member (31, 31c) or the second filter member (32, 32c) is a variable filter, or both are variable filters. A frequency component in the frequency band that the first filter member (31, 31c) attenuates differs from a frequency component in the frequency band that the second filter member (32, 32c) attenuates. The capacitor (C3, C23) is connected by shunt connection between the connector between the first filter member (31, 31c) and the second filter member (32, 32c) and the reference electric potential.

With this structure, the radio frequency module (1, 1a, 1b, 1c) can efficiently prevent the harmonic waves.

A radio frequency module (1a) according to a third aspect further includes the switch member (60) and a filter member (for example, the fixed filter circuit 50) in addition to the first or second aspect. The switch member (60) switches between electrical connection between a transmission circuit (for example, the third transmission circuit 103) that transmits the signal in the third communication band and the antenna connection terminal (10) and electrical connection between the antenna connection terminal (10) and the common terminal (21). The filter member is disposed between the transmission circuit and the switch member (60) and attenuates a signal at a frequency higher than the frequency of the signal that is transmitted by the transmission circuit.

With this structure, the size of the antenna switch (20a) of the radio frequency module (1a) can be decreased by providing another filter member for the third communication band other that the filter circuit (30).

For example, when the third communication band is the communication band of the 2G standard, signal transmission needs a large amount of transmission power. In the case where a single antenna switch switches between communication of the 2G standard and communication of another standard (for example, the 3G or 4G standard), the component size of the antenna switch is increased in consideration of withstand voltage for communication of the 2G standard. Providing the other filter member for the third communication band other than the filter circuit (30) eliminates the necessity of switching between communication of the 2G standard and communication of the other standard (for example, the 3G or 4G standard) by the single antenna switch (20a). Accordingly, it is not necessary to consider the withstand voltage for communication of the 2G standard regarding the antenna switch 20a, and the size of the antenna switch (20a) can be decreased.

A radio frequency module (1b) according to a fourth aspect further includes a switch member (for example, the second switch member 201) and a filter member (for example, the fixed filter circuit 50) in addition to the first or second aspect. The switch member switches between a connection state and a non-connection state between the transmission circuit (for example, the third transmission circuit 103) that transmits the signal in the third communication band and the antenna connection terminal (10). The filter member is disposed between the transmission circuit and the switch member and attenuates a signal at a frequency higher than the frequency of the signal that is transmitted by the transmission circuit.

With this structure, the switch member is not disposed between the filter member and the antenna connection terminal (10), the loss of the transmission signal in communication in the first communication band and the second communication band can be reduced. That is, the communication efficiency can be improved.

A radio frequency module (1c) according to a fifth aspect further includes a switch member (for example, the second switch member 201) and a filter member (for example, the fixed filter circuit 70) in addition to the second aspect. The switch member switches between a connection state and a non-connection state between the transmission circuit (for example, the third transmission circuit 103) that transmits the signal in the third communication band and the connector (33c). The filter member is disposed between the third transmission circuit (103) and the switch member and attenuates a signal at a frequency higher than the frequency of the signal that is transmitted by the transmission circuit.

With this structure, the switch member is not disposed between the filter member and the antenna connection terminal (10), and the loss of the transmission signal in communication in the first communication band and the second communication band can be reduced. The switch member is not connected between the filter member and the antenna connection terminal (10), and the loss of the transmission signal in communication in the third communication band can be reduced.

In a radio frequency module (1b, 1c) according to a sixth aspect, the switch member is a single-pole single-throw switch (SPST switch) in addition to the fourth or fifth aspect.

With this structure, the communication efficiency can be improved unlike the case of using a SPMT switch. For example, in the case of using a capacitor as a reactance element, the stray capacitance of the capacitor in which the connection state with the switch is OFF can be decreased. Consequently, the communication efficiency can be improved.

In a radio frequency module (1, 1a, 1b, 1c) according to a seventh aspect, the first communication band corresponds to the communication band of the third generation mobile communication standard, and the second communication band corresponds to the communication band of the fourth generation mobile communication standard in addition to any one of the first to sixth aspects.

In a radio frequency module (1a, 1b, 1c) according to an eighth aspect, the first communication band corresponds to the communication band of the third generation mobile communication standard, the second communication band corresponds to the communication band of the fourth generation mobile communication standard, and the third communication band corresponds to the communication band of the second generation mobile communication standard in addition to any one of the third to sixth aspects.

A communication device (2, 2a, 2b, 2c) according to a ninth aspect includes the radio frequency module (1, 1a, 1b, 1c) according to any one of the first to seventh aspects and the antenna (40) that is electrically connected to the antenna connection terminal (10). The radio frequency module (1, 1a, 1b, 1c) includes the first transmission circuit (101) that transmits the signal in the first communication band and the second transmission circuit (102) that transmits the signal in the second communication band.

With this structure, harmonic wave components in multiple communication bands (the first communication band and the second communication band) can be reduced. The size can be smaller than that in the case where the multiple filter circuits corresponding to the transmission circuits are provided, that is, the size can be prevented from increasing. In addition, the loss of the fundamental wave (transmission signal at the fundamental frequency) of the transmission signal can be reduced.

A communication device (2a, 2b, 2c) according to a tenth aspect includes the radio frequency module (1a, 1b, 1c) according to any one of the third to sixth aspects and the eighth aspect and the antenna (40) that is electrically connected to the antenna connection terminal (10). The radio frequency module (1, 1a, 1b, 1c) includes the first transmission circuit (101) that transmits the signal in the first communication band, the second transmission circuit (102) that transmits the signal in the second communication band, and the third transmission circuit (103) that transmits the signal in the third communication band.

With this structure, harmonic wave components in multiple communication bands (the first communication band and the second communication band) can be reduced. The size can be smaller than that in the case where the multiple filter circuits corresponding to the transmission circuits are provided, that is, the size can be prevented from increasing. In addition, the loss of the fundamental wave (transmission signal at the fundamental frequency) of the transmission signal can be reduced.

While embodiments of the invention have been described above, it is to be understood that variations and modifications will be apparent to those skilled in the art without necessarily departing from the scope and spirit of the invention. The scope of the invention, therefore, is to be determined solely by the following claims.

What is claimed is:

1. A radio frequency module comprising:
  an antenna connection terminal that is electrically connected to an antenna;
  an antenna switch comprising a common terminal that is electrically connected to the antenna connection terminal, a first connection terminal that is configured to receive a first signal in a first communication band, and a second connection terminal that is configured to receive a second signal in a second communication band, the antenna switch being configured to selectively switch connection of the common terminal between the first connection terminal and the second connection terminal, wherein the second communication band has a higher frequency than the first communication band; and
  a filter circuit that is between the antenna connection terminal and the common terminal, that has a pass band comprising frequencies of a fundamental wave of the first signal and a fundamental wave of the second signal, and that has an attenuation band comprising frequencies of a harmonic wave of the first signal and a harmonic wave of the second signal,
  wherein the filter circuit comprises a variable reactance element, and
  wherein, when the second connection terminal is connected to the common terminal, the variable reactance element is configured to shift the attenuation band of the filter circuit to be greater than when the first connection terminal is connected to the common terminal.

2. The radio frequency module according to claim 1,
  wherein the filter circuit comprises a capacitor, a first filter, and a second filter that is connected to the first filter in series,
  wherein the first filter, the second filter, or both the first filter and the second filter are a variable filter,
  wherein an attenuation band of the first filter differs from an attenuation band of the second filter, and
  wherein the capacitor is shunt connected between a node and a reference electric potential, the node being between the first filter and the second filter.

3. The radio frequency module according to claim 1, further comprising:
  a switch configured to selectively switch connection of the antenna connection terminal between the common terminal and a transmission circuit configured to transmit a third signal in a third communication band; and
  a filter that is between the transmission circuit and the switch, and that is configured to attenuate a fourth signal at a frequency greater than the third signal.

4. The radio frequency module according to claim 2, further comprising:
  a switch configured to selectively switch connection of the antenna connection terminal between the common terminal and a transmission circuit configured to transmit a third signal in a third communication band and the common terminal; and
  a filter that is between the transmission circuit and the switch, and that is configured to attenuate a fourth signal at a frequency greater than the third signal.

5. The radio frequency module according to claim 1, further comprising:
  a switch configured to selectively switch connection of the antenna connection terminal to a transmission circuit configured to transmit a third signal in a third communication band; and a filter that is between the transmission circuit and the switch, and that is configured to attenuate a fourth signal at a frequency greater than the third signal.

6. The radio frequency module according to claim 2, further comprising:
 a switch configured to selectively switch connection of the antenna connection terminal to a transmission circuit configured to transmit a third signal in a third communication band; and
 a filter that is between the transmission circuit and the switch, and that is configured to attenuate a fourth signal at a frequency greater than the third signal.

7. The radio frequency module according to claim 2, further comprising:
 a switch configured to selectively switch connection of the node to a transmission circuit configured to transmit a third signal in a third communication band; and
 a filter that is between the transmission circuit and the switch, and that is configured to attenuate a fourth signal at a frequency greater than the third signal.

8. The radio frequency module according to claim 5, wherein the switch is a single-pole single-throw switch.

9. The radio frequency module according to claim 7, wherein the switch is a single-pole single-throw switch.

10. The radio frequency module according to claim 1, wherein the first communication band corresponds to a communication band of a third generation mobile communication standard, and the second communication band corresponds to a communication band of a fourth generation mobile communication standard.

11. The radio frequency module according to claim 3, wherein the first communication band corresponds to a communication band of a third generation mobile communication standard, the second communication band corresponds to a communication band of a fourth generation mobile communication standard, and the third communication band corresponds to a communication band of a second generation mobile communication standard.

12. A communication device comprising:
 the radio frequency module according to claim 1; and
 the antenna that is electrically connected to the antenna connection terminal,
 wherein the radio frequency module further comprises a first transmission circuit configured to transmit the first signal, and a second transmission circuit configured to transmit the second signal.

13. A communication device comprising:
 the radio frequency module according to claim 3; and
 the antenna that is electrically connected to the antenna connection terminal,
 wherein the radio frequency module further comprises a first transmission circuit configured to transmit the first signal, a second transmission circuit configured to transmit the second signal, and a third transmission circuit configured to transmit the third signal.

\* \* \* \* \*